(12) United States Patent
Tsai

(10) Patent No.: US 12,029,933 B2
(45) Date of Patent: Jul. 9, 2024

(54) ROTATION EXERCISING BALL STRUCTURE

(71) Applicant: Yu-Lun Tsai, Taichung (TW)

(72) Inventor: Yu-Lun Tsai, Taichung (TW)

( * ) Notice: Subject to any disclaimer, the term of this patent is extended or adjusted under 35 U.S.C. 154(b) by 177 days.

(21) Appl. No.: 17/898,654

(22) Filed: Aug. 30, 2022

(65) Prior Publication Data

US 2024/0066346 A1 Feb. 29, 2024

(51) Int. Cl.
*A63B 21/06* (2006.01)
*A63B 21/00* (2006.01)
*A63B 21/22* (2006.01)
*A63B 24/00* (2006.01)
*A63B 43/00* (2006.01)
*H05K 5/00* (2006.01)
*H05K 5/02* (2006.01)

(52) U.S. Cl.
CPC ...... *A63B 21/0608* (2013.01); *A63B 21/0004* (2013.01); *A63B 21/222* (2015.10); *A63B 21/4047* (2015.10); *A63B 24/0062* (2013.01); *A63B 43/004* (2013.01); *H05K 5/0073* (2013.01); *H05K 5/0247* (2013.01); *A63B 2209/08* (2013.01); *A63B 2220/833* (2013.01); *A63B 2220/89* (2013.01); *A63B 2225/54* (2013.01)

(58) Field of Classification Search
CPC ............ A63B 21/0608; A63B 21/0004; A63B 21/4047; A63B 24/0062; A63B 43/004; A63B 2209/08; A63B 2220/833; A63B 2220/89; A63B 2225/54; A63B 2220/17; A63B 21/222; A63B 2225/50; A63B 21/22; H05K 5/0073; H05K 5/0247
See application file for complete search history.

(56) References Cited

U.S. PATENT DOCUMENTS

| | | | | |
|---|---|---|---|---|
| 4,640,508 | A | * | 2/1987 | Escher ............. A63B 23/03508 482/110 |
| 5,800,311 | A | * | 9/1998 | Chuang .................. A63B 23/14 482/44 |
| 6,461,276 | B1 | * | 10/2002 | Yu ......................... A63B 21/222 482/44 |
| 2016/0367852 | A1 | * | 12/2016 | Chuang ................ A63B 21/222 |
| 2017/0106249 | A1 | * | 4/2017 | Marton ............ A63B 21/00178 |
| 2022/0193478 | A1 | | 6/2022 | Tsai |

* cited by examiner

*Primary Examiner* — Joshua Lee
*Assistant Examiner* — Catrina A Letterman
(74) *Attorney, Agent, or Firm* — Chun-Ming Shih; LANWAY IPR SERVICES

(57) ABSTRACT

A rotation exercising ball structure includes two shells, two pivot seats, two holding members, a weight unit, a first housing, a second housing, and a PCB (printed circuit board). The two shells are combined together to construct a hollow ball. The weight unit includes a mandrel pivotally connected with the hollow ball, two magnets secured to the mandrel, at least one rotation member connected with the mandrel, and a weight connected with the at least one rotation member. The PCB is electrically connected with a Bluetooth transmission device which is electrically connected with a Hall sensor. When the mandrel is rotated, the Hall sensor detects rotation of the magnets and sends information of rotation of the magnets to the PCB, and the PCB processes and transmits the information to the Bluetooth transmission device.

12 Claims, 15 Drawing Sheets

ROTATION EXERCISING BALL STRUCTURE

BACKGROUND OF THE INVENTION

1. Field of the Invention

The present invention relates to an exercising device and, more particularly, to a rotation (or gyration) exercising ball structure.

2. Description of the Related Art

The closest prior art reference of which the applicant is aware was disclosed in his U.S. Patent publication No. 20220193478, entitled by "ROTATION STRUCTURE", which comprises a main body 10, two bearings 34 mounted in the main body 10, a mandrel 30 mounted between the two bearings 34, a rotation member 32 having a first end connected with the mandrel 30, and a weight 36 mounted on a second end of the rotation member 32. The main body 10 includes two shells 20 and 21 juxtaposed to each other and combined together. The main body 10 has an exterior provided with two finger holes 12 and two operation portions 14. The main body 10 has an interior provided with a receiving chamber 22 and two mounting recesses 24. The mandrel 30 has two ends pivotally mounted on the two bearings 34. The two bearings 34 are mounted in the two mounting recesses 24 respectively when the two shells 20 and 21 cover each other. The weight 36 is rotatable in the receiving chamber 22. In operation, the user's two hands hold and move the two operation portions 14 so that the main body 10 is rotated, and the rotation member 32 and the weight 36 are pivoted about the mandrel 30 to produce a centrifugal force. At this time, the two operation portions 14 function as a pivot fulcrum. In such a manner, the user's two hands has to overcome the centrifugal force produced by the weight 36 so as to achieve an exercising effect. Thus, the rotation structure exercises the user's two hands.

However, the conventional rotation structure has the following disadvantages.

1. The two bearings 34 are mounted in the two mounting recesses 24 respectively and apply a force on the two mounting recesses 24 so that after the main body 10 is rotated is operated during a period of time, the two mounting recesses 24 are easily cracked or broken, and the two bearings 34 will be dropped.
2. The main body 10 is formed by the two shells 20 and 21 juxtaposed to each other so that the connection between the two shells 20 and 21 has a weakened strength. Thus, the main body 10 is easily deformed or broken from the connection of the two shells 20 and 21.
3. The rotation structure cannot provide a corresponding information, such as the time interval, the swinging times, the consumed calory or the like, during rotation of the main body 10, thereby causing inconvenience to the user when wishing to understand the corresponding information.

BRIEF SUMMARY OF THE INVENTION

The primary objective of the present invention is to provide a rotation exercising ball structure that achieving a hand exercising effect by a centrifugal rotating motion.

In accordance with the present invention, there is provided a rotation exercising ball structure comprising two shells, two pivot seats, two holding members, a weight unit, a first housing, a second housing, and a PCB (printed circuit board). The two shells are combined together to construct a hollow ball. Each of the two shells has an interior provided with a space. The space has a bottom provided with a fixing hole. The fixing hole is located at a center of the space and penetrates each of the two shells. The bottom of the space is provided with a positioning seat. The positioning seat is formed with a through hole. The through hole penetrates the positioning seat and is connected to the fixing hole. Each of the two shells has an inner wall formed between the through hole and the fixing hole. The two pivot seats are combined with the positioning seats of the two shells respectively. Each of the two pivot seats is provided with a perforation. The two holding members are mounted on the two shells respectively and cover the fixing holes of the two shells respectively. Each of the two holding members has an inner side and an outer side. The weight unit includes a mandrel, two magnets, at least one rotation member, and a weight. The mandrel is arranged transversely in the hollow ball and has two ends pivotally connected with the hollow ball. The two magnets are secured to one of the two ends of the mandrel. The at least one rotation member is connected with the mandrel. The at least one rotation member extends radially from a center of the mandrel. The weight is connected with the at least one rotation member. The weight is a radial curved plate. The weight is rotatable in the hollow ball radially and centrifugally with the mandrel served as an axis. The mandrel is rotated by the at least one rotation member. The first housing and the second housing are mounted on the inner sides of the two holding members respectively by multiple screws. The first housing and the second housing are inserted into the fixing holes of the two shells and combined with the inner walls of the two shells. The PCB is mounted in the first housing. The PCB is electrically connected with a Bluetooth transmission device. The Bluetooth transmission device is electrically connected with a Hall sensor. When the mandrel is rotated, the Hall sensor detects rotation of the two magnets and sends information of rotation of the two magnets to the PCB, and the PCB processes and transmits the information to the Bluetooth transmission device.

According to the primary advantage of the present invention, when the hollow ball is rotated, the weight is started and oscillated easily to produce a larger centrifugal force.

According to another advantage of the present invention, the mandrel, the at least one rotation member, and the weight are rotated steadily and stably.

Further benefits and advantages of the present invention will become apparent after a careful reading of the detailed description with appropriate reference to the accompanying drawings.

BRIEF DESCRIPTION OF THE SEVERAL VIEWS OF THE DRAWING(S)

DETAILED DESCRIPTION OF THE INVENTION

Figure 1:
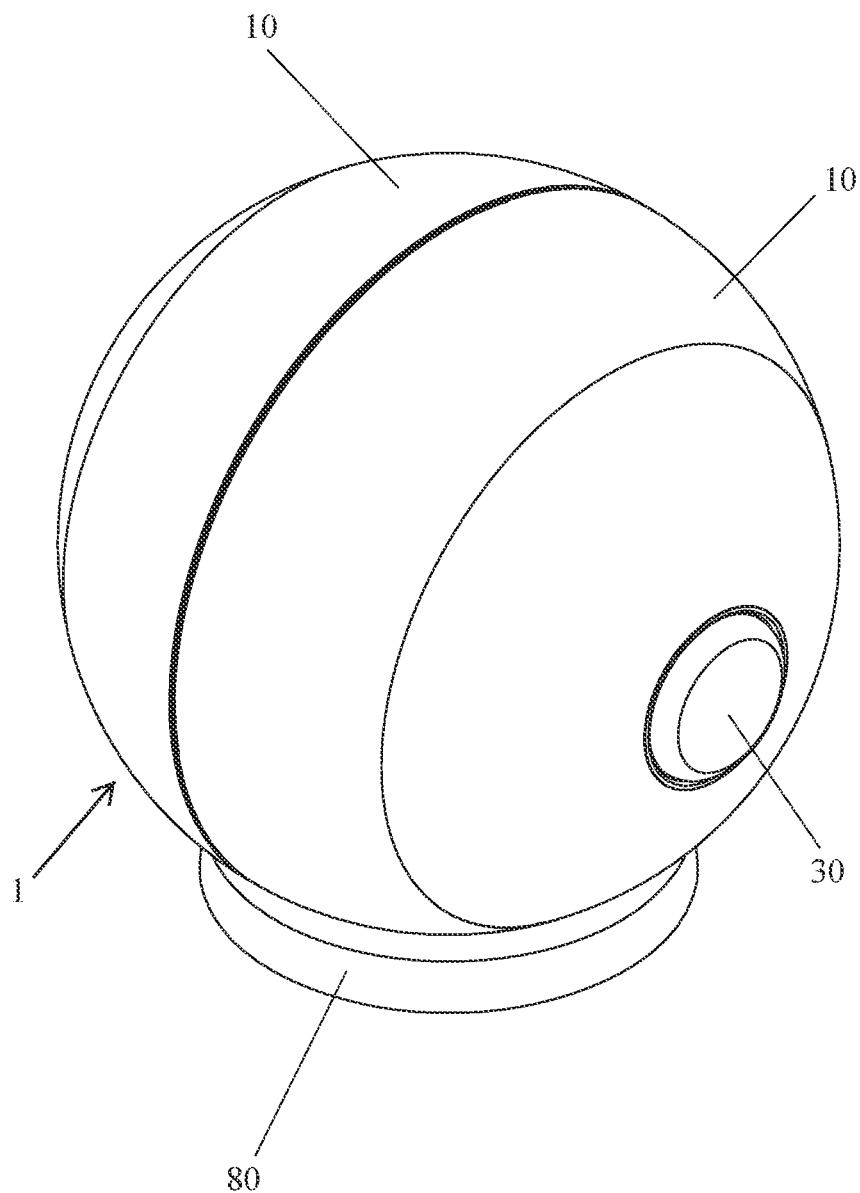
FIG. 1 is a perspective view of a rotation exercising ball structure in accordance with the preferred embodiment of the present invention.

Referring to the drawings and initially to FIGS. 1-14, a rotation exercising ball structure in accordance with the preferred embodiment of the present invention comprises two shells 10, two pivot seats (or mounting seats) 20, two holding members 30, a weight unit 40, a first housing 51, a second housing 52, and a PCB (printed circuit board) 50.

The two shells 10 are combined together to construct a hollow ball 1. Each of the two shells 10 has an interior provided with a space 11. The space 11 has a bottom provided with a fixing hole (or securing hole) 12. The fixing hole 12 is located at a center of the space 11 and penetrates each of the two shells 10. The bottom of the space 11 is provided with a positioning seat 13. The positioning seat 13 is formed with a through hole 131. The through hole 131 penetrates the positioning seat 13 and is connected to the fixing hole 12. Each of the two shells 10 has an inner wall 14 formed between the through hole 131 and the fixing hole 12.

The two pivot seats 20 are combined with the positioning seats 13 of the two shells 10 respectively. Each of the two pivot seats 20 is provided with a perforation 21.

The two holding members 30 are mounted on the two shells 10 respectively and cover the fixing holes 12 of the two shells 10 respectively. Each of the two holding members 30 has an inner side and an outer side.

The weight unit 40 includes a mandrel 41, two magnets 46, at least one rotation member 43, and a weight 44. The mandrel 41 is arranged transversely in the hollow ball 1 and has two ends pivotally connected with the hollow ball 1. The two magnets 46 are secured to one of the two ends of the mandrel 41. The at least one rotation member 43 is connected with the mandrel 41. The at least one rotation member 43 extends radially from a center of the mandrel 41. The weight 44 is connected with the at least one rotation member 43. The weight 44 is a radial curved plate. The weight 44 is rotatable in the hollow ball 1 radially and centrifugally with the mandrel 41 served as an axis. The mandrel 41 is rotated by the at least one rotation member 43.

The first housing 51 and the second housing 52 are mounted on the inner sides of the two holding members 30 respectively by multiple screws 60. The first housing 51 and the second housing 52 are inserted into the fixing holes 12 of the two shells 10 and combined with the inner walls 14 of the two shells 10.

The PCB 50 is mounted in the first housing 51. The PCB 50 is electrically connected with a Bluetooth transmission device 53. The Bluetooth transmission device 53 is electrically connected with a Hall sensor 54 (see FIG. 11). The Hall sensor 54 aligns with the two magnets 46. In practice, when the mandrel 41 is rotated, the Hall sensor 54 detects rotation of the two magnets 46 and sends information of rotation of the two magnets 46 to the PCB 50, and the PCB 50 processes (including calculating and converting) and transmits the information to the Bluetooth transmission device 53.

In the preferred embodiment of the present invention, the hollow ball 1 is mounted on a base 80.

In the preferred embodiment of the present invention, the inner wall 14 of each of the two shells 10 is provided with multiple positioning rails 15 (see FIG. 3), and the first housing 51 and the second housing 52 are positioned and locked on the positioning rails 15 of the two shells 10 respectively.

In the preferred embodiment of the present invention, the bottom of the space 11 is provided with a receiving recess 16. The positioning seat 13 is located in the receiving recess 16. Each of the two shells 10 has an interior provided with multiple first reinforcing ribs 17 formed between a periphery of the receiving recess 16 and an inside of each of the two shells 10.

In the preferred embodiment of the present invention, each of the two shells 10 has an opening having a periphery provided with multiple second reinforcing ribs 18 which are arranged and distributed evenly.

In the preferred embodiment of the present invention, each of the two shells 10 is provided with multiple threaded positioning members 19 arranged between the receiving recess 16 and the positioning seat 13. Each of the two pivot seats 20 has a periphery provided with multiple positioning holes 23 aligning with the positioning members 19 of one of the two shells 10. Multiple screws 70 extend through the positioning holes 23 and are screwed into the positioning members 19 to secure the two pivot seats 20 to the positioning seats 13 of the two shells 10 respectively.

In the preferred embodiment of the present invention, each of the two ends of the mandrel 41 is pivotally mounted in the perforation 21 of one of the two pivot seats 20 and the through hole 131 of the positioning seat 13 of one of the two shells 10. Each of the two ends of the mandrel 41 is pivotally connected with at least one bearing 42 (preferably two bearings 42). The perforation 21 of each of the two pivot seats 20 has two ends each provided with an enlarged mounting face 22, and the at least one bearing 42 is mounted on the mounting face 22 of the perforation 21.

In the preferred embodiment of the present invention, the at least one rotation member 43 is a bending rod and has a bent section secured on the mandrel 41 and two ends secured to the weight 44.

Figure 3:
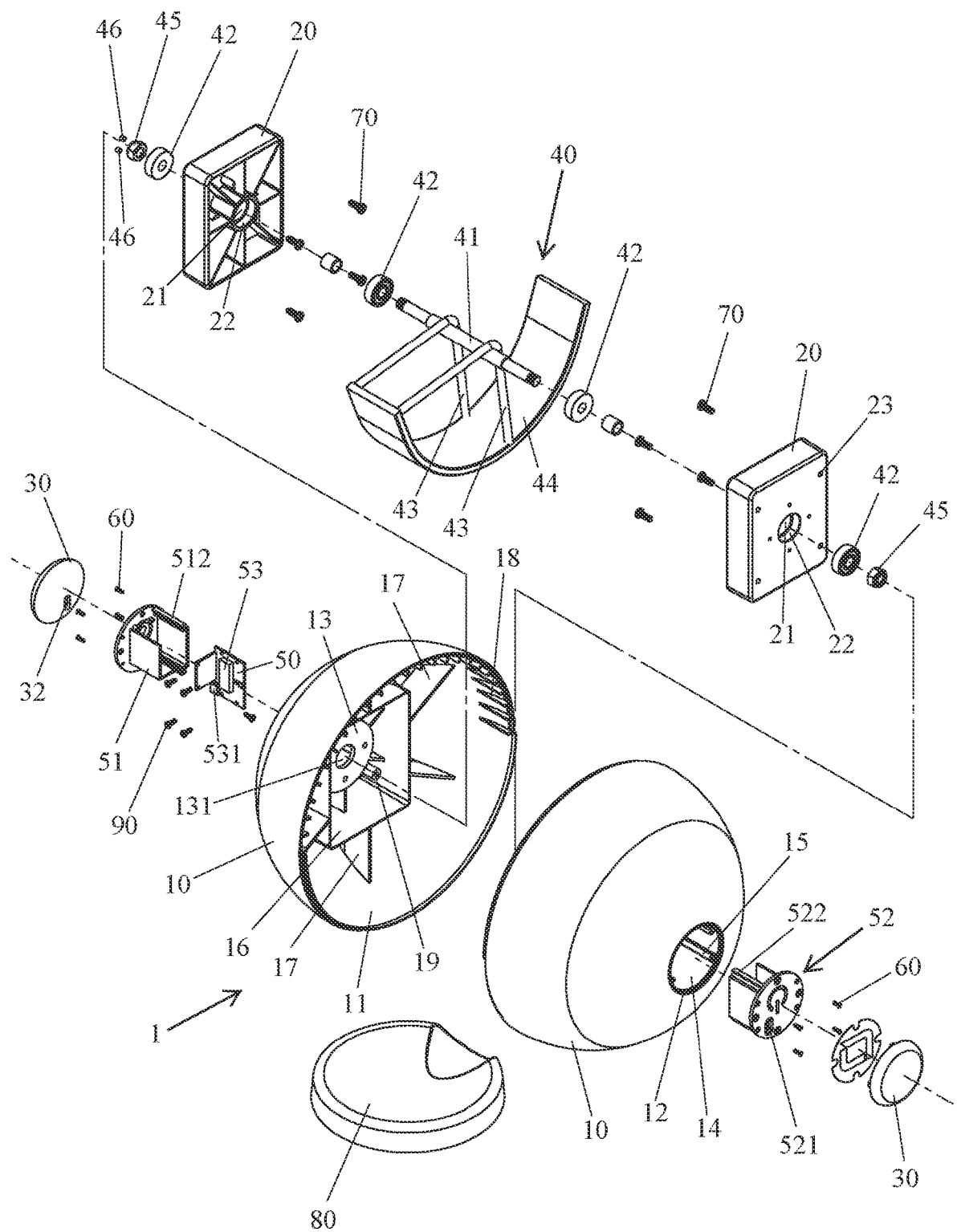
FIG. 3 is an exploded perspective view of the rotation exercising ball structure in accordance with the preferred embodiment of the present invention.

In the preferred embodiment of the present invention, the two ends of the at least one rotation member 43 are located at an eccentric position of the weight 44 as shown in FIG. 3.

Figure 14:
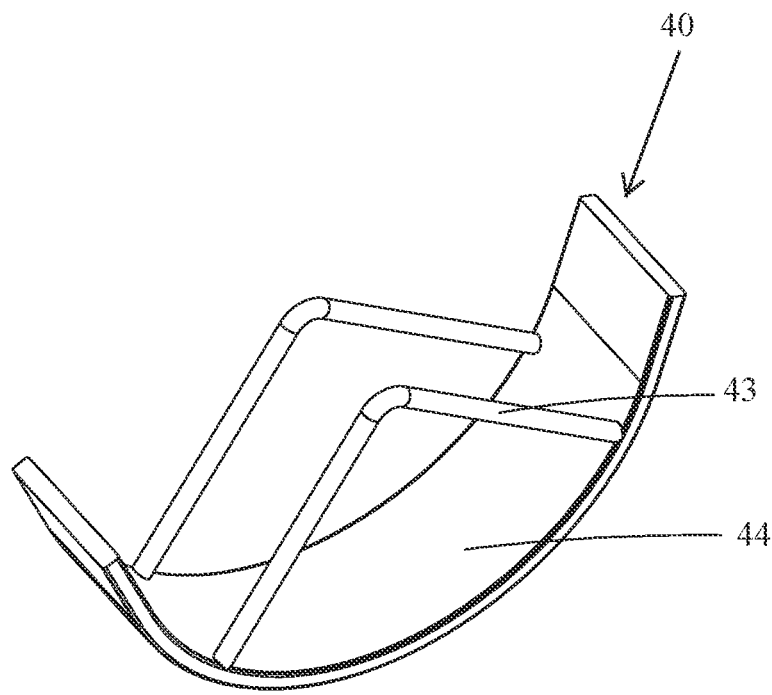
FIG. 14 is a perspective view of a weight of the rotation exercising ball structure in accordance with another preferred embodiment of the present invention.

Alternatively, the two ends of the at least one rotation member 43 are located at a middle or central position of the weight 44 as shown in FIG. 14.

In the preferred embodiment of the present invention, a power supply switch 31 is mounted on one of the two holding members 30. The power supply switch 31 is electrically connected with the PCB 50, the Hall sensor 54, and the Bluetooth transmission device 53 to electrically control an electric power of the PCB 50, the Hall sensor 54, and the Bluetooth transmission device 53.

Figure 13:
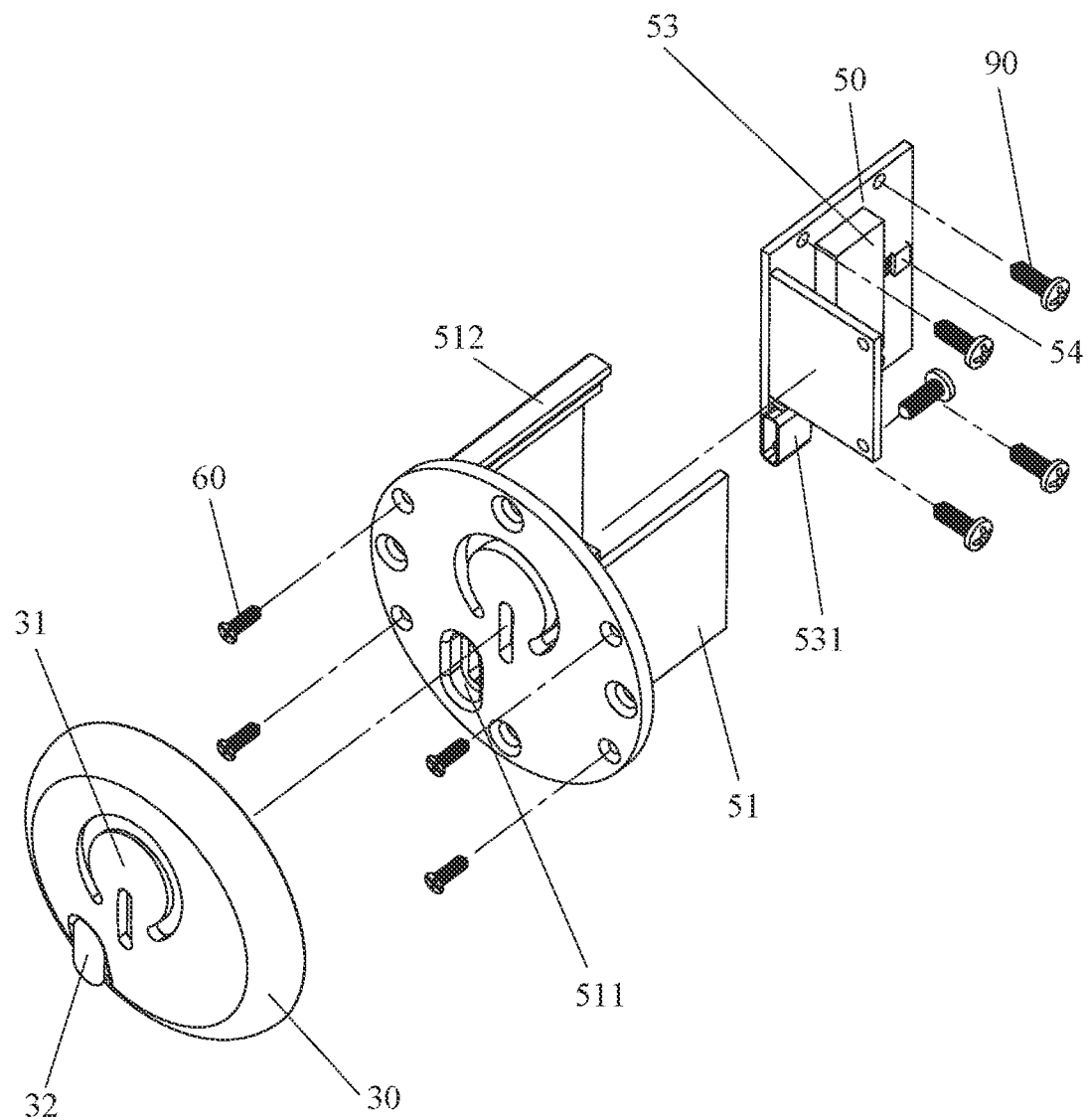
FIG. 13 is a partial exploded perspective view of the rotation exercising ball structure in accordance with the preferred embodiment of the present invention.

In the preferred embodiment of the present invention, the first housing 51 is provided with a passage 511 (see FIG. 13). The second housing 52 is provided with a passage 521 (see FIG. 3). The PCB 50 is electrically connected with a transmission slot 531 connected to the passage 511 of the first housing 51. One of the two holding members 30 is provided with an entrance 32 connected to the passage 511 of the first housing 51.

In the preferred embodiment of the present invention, the first housing 51 is provided with multiple locking rails 512. The second housing 52 is provided with multiple locking rails 522. The PCB 50 is inserted into the first housing 51 and locked by the locking rails 512 of the first housing 51.

In the preferred embodiment of the present invention, two nuts 45 are screwed onto the two ends of the mandrel 41, and the two magnets 46 are secured to one of the two nuts 45 and located adjacent to the Hall sensor 54.

In the preferred embodiment of the present invention, each of the two shells 10 is made of plastic material.

In the preferred embodiment of the present invention, the perforation 21 is located at a center of each of the two pivot seats 20.

In the preferred embodiment of the present invention, the outer side of each of the two holding members 30 is made of silicone or silica gel.

In the preferred embodiment of the present invention, the PCB 50 is secured to the first housing 51 by multiple nuts 90.

In the preferred embodiment of the present invention, the PCB 50 is provided with a chargeable lithium battery.

Figure 15:
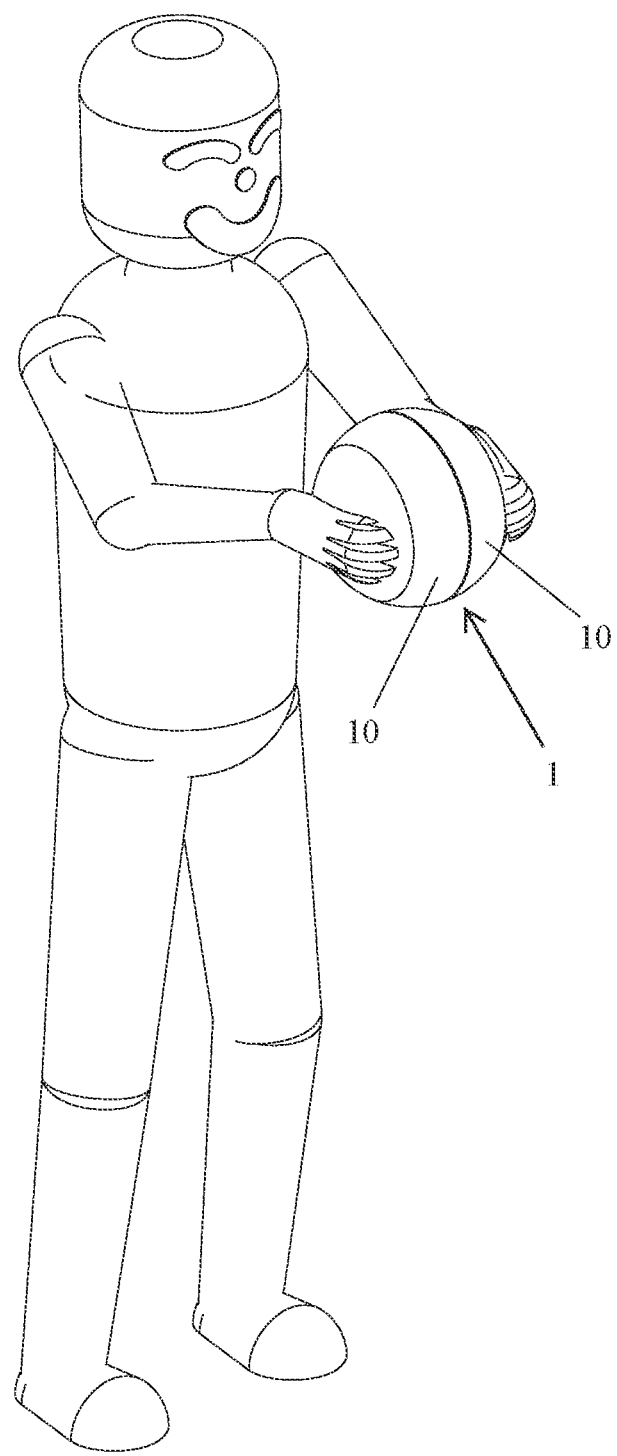
FIG. 15 is a schematic operational view of the rotation exercising ball structure in accordance with the preferred embodiment of the present invention.

In operation, referring to FIG. 15 with reference to FIGS. 1-14, a user's two hands hold the two holding members 30 to rotate the hollow ball 1. At this time, the linear distance between the user's two palms is served as a fulcrum of the revolving shaft. In such a manner, when the hollow ball 1 is rotated, the weight 44 is revolved in the hollow ball 1 and produces a centrifugal force so that the user has to apply a resistant force to counteract the centrifugal force, thereby achieving an exercising effect. At the same time, when the mandrel 41 is rotated, the two magnets 46 are also rotated with the mandrel 41. Thus, when the two magnets 46 are rotated, the Hall sensor 54 detects information (or data) during rotation of the two magnets 46 and sends the information of rotation of the two magnets 46 to the PCB 50, and the PCB 50 processes and electrically transmits the information to the Bluetooth transmission device 53. Finally, the Bluetooth transmission device 53 wirelessly transmits the information to an external portable electronic device, such as a smart phone or a tablet computer.

Alternatively, an adapter, such as a USB connector or the like, in turn extends through the entrance 32 of one of the two holding members 30 and the passage 511 of the first housing 51, and is inserted into the transmission slot 531 of the PCB 50.

Accordingly, the rotation exercising ball structure has the following advantages.

Figure 2:
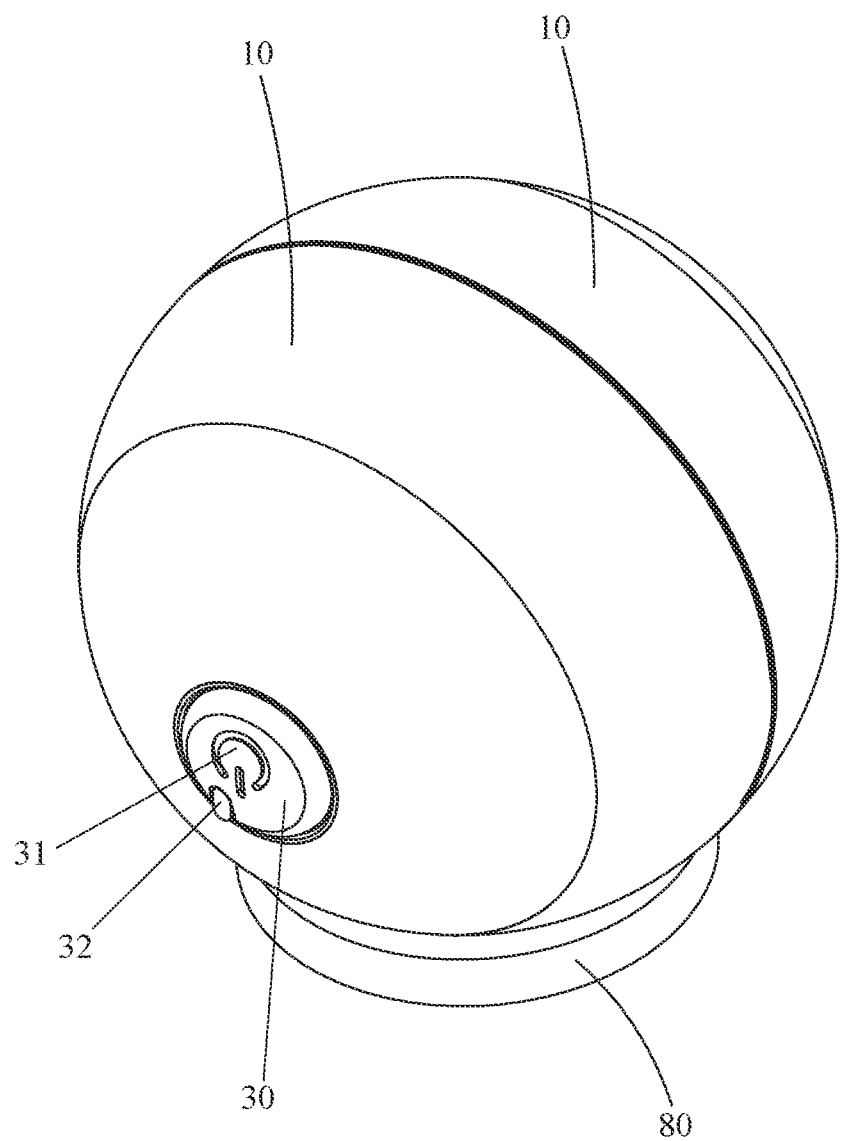
FIG. 2 is another perspective view of the rotation exercising ball structure in accordance with the preferred embodiment of the present invention.
Figure 4:
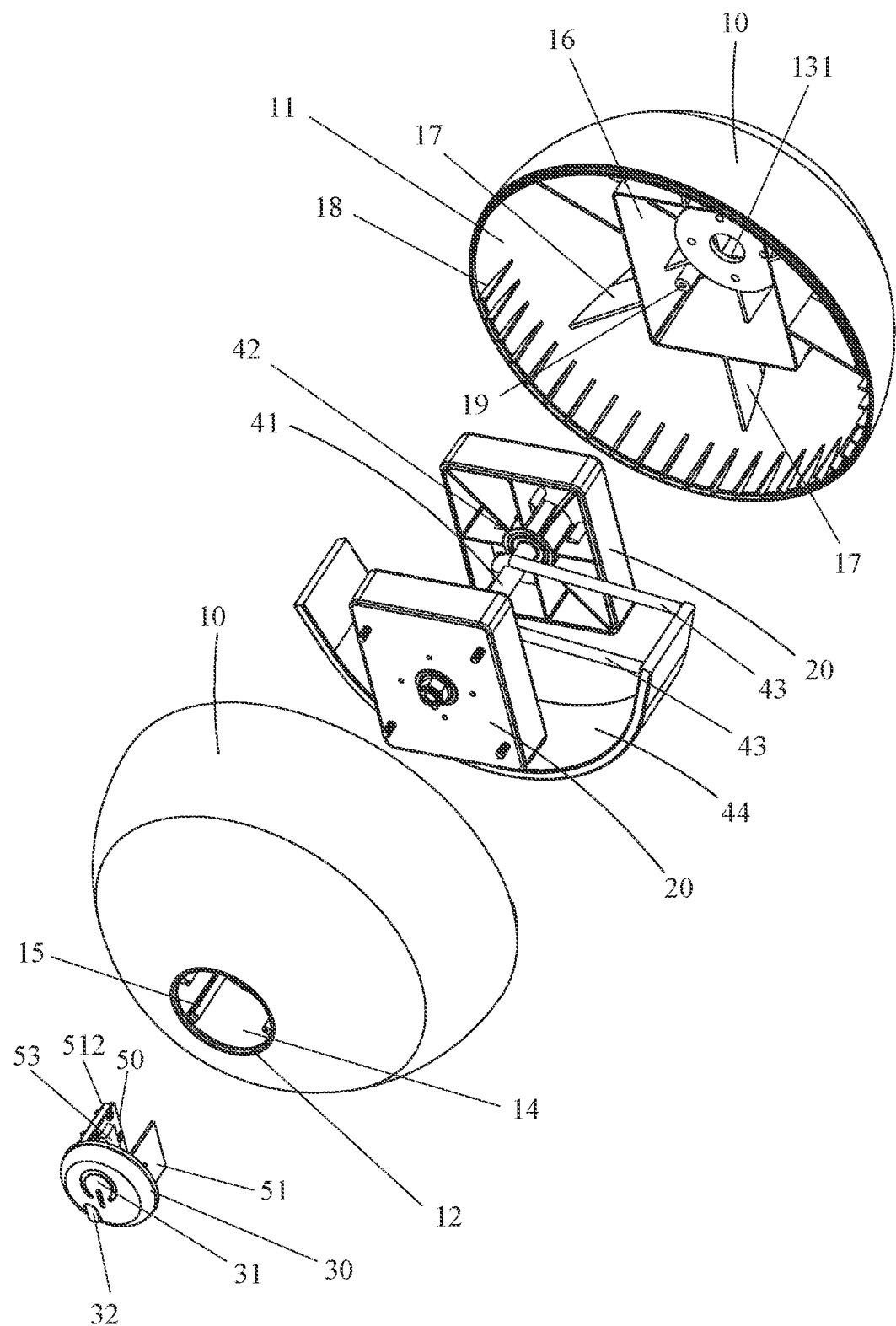
FIG. 4 is a partial exploded perspective view of the rotation exercising ball structure in accordance with the preferred embodiment of the present invention.
Figure 5:
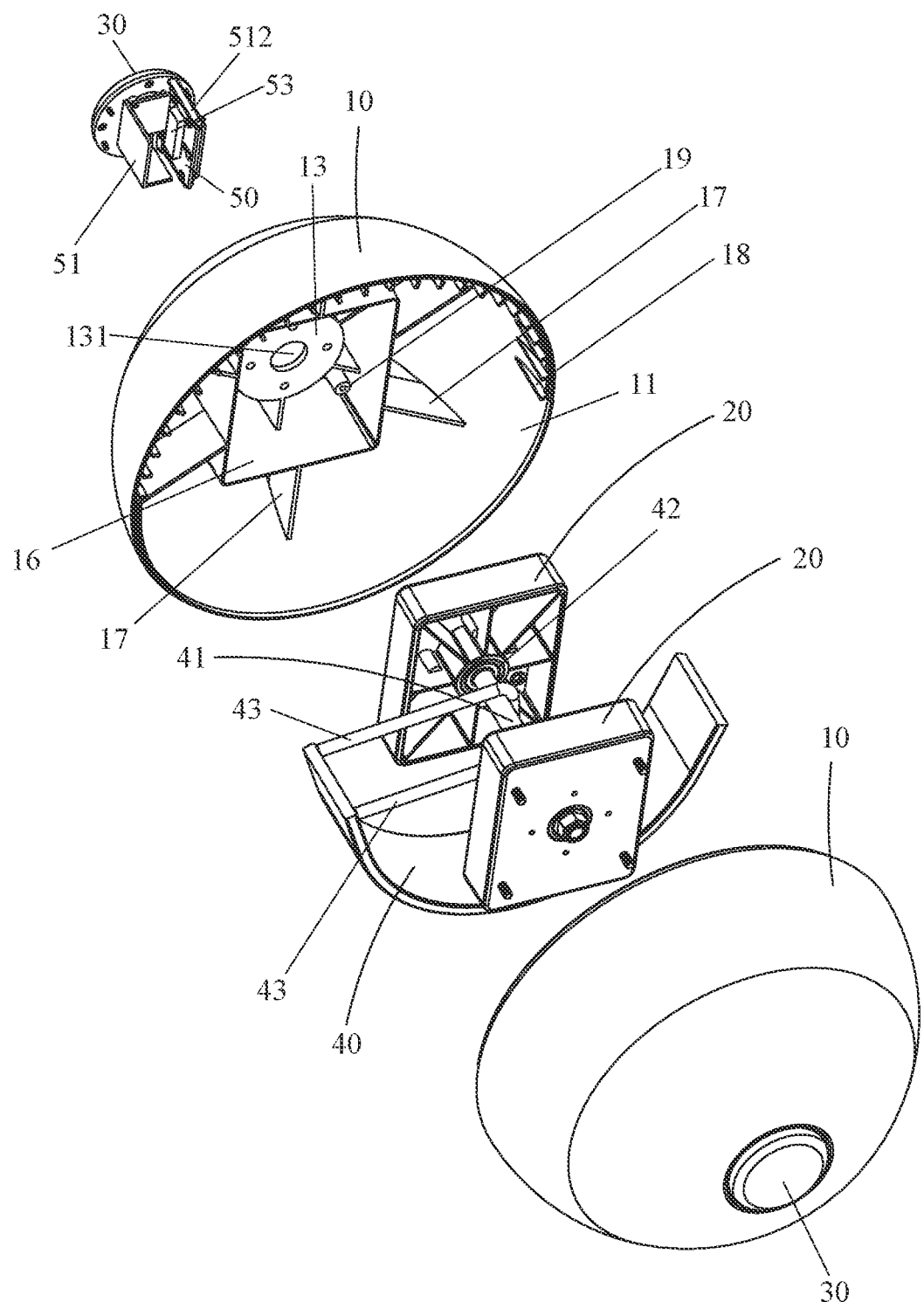
FIG. 5 is another partial exploded perspective view of the rotation exercising ball structure in accordance with the preferred embodiment of the present invention.
Figure 6:
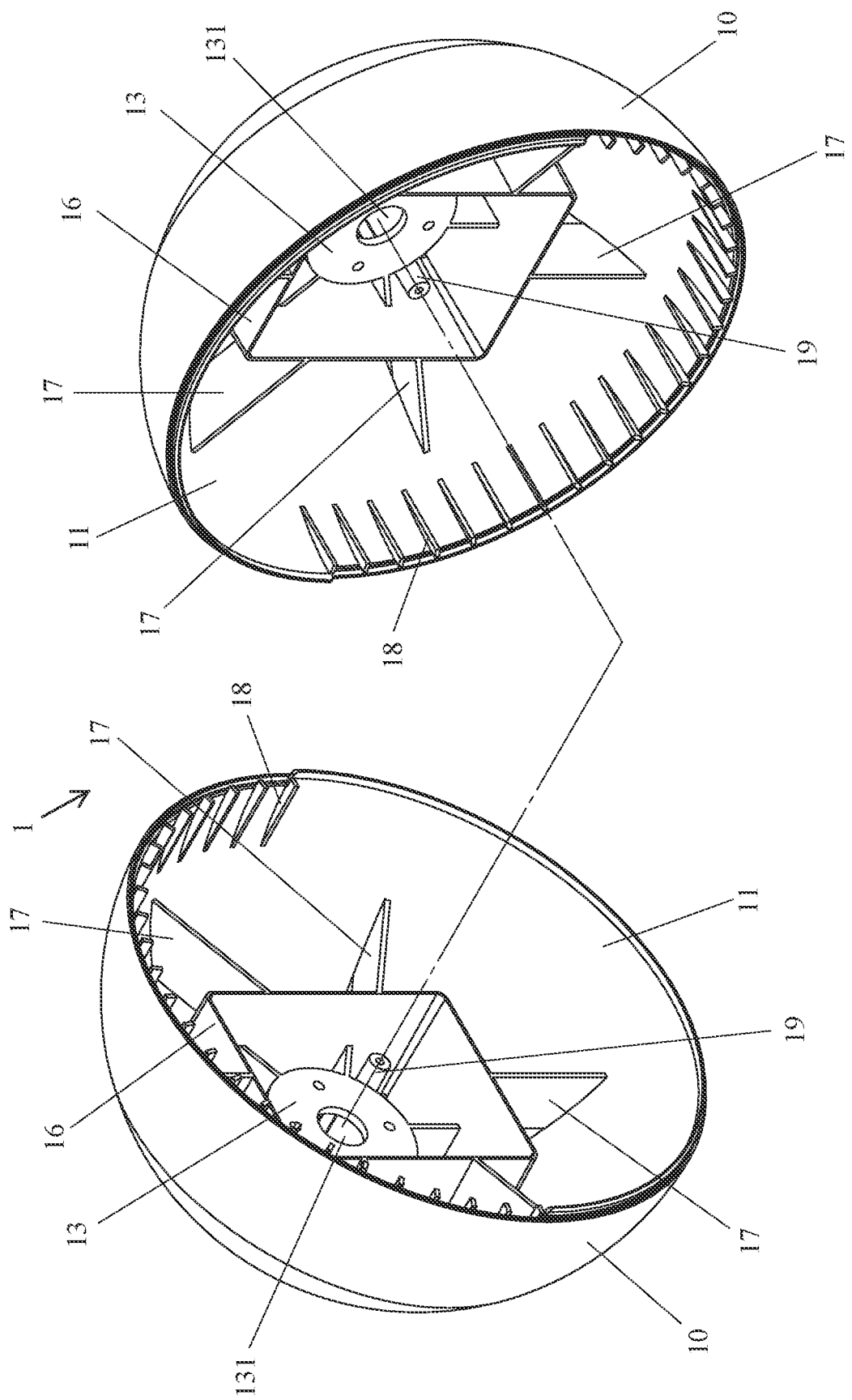
FIG. 6 is a perspective view of two shells of the rotation exercising ball structure in accordance with the preferred embodiment of the present invention.
Figure 7:
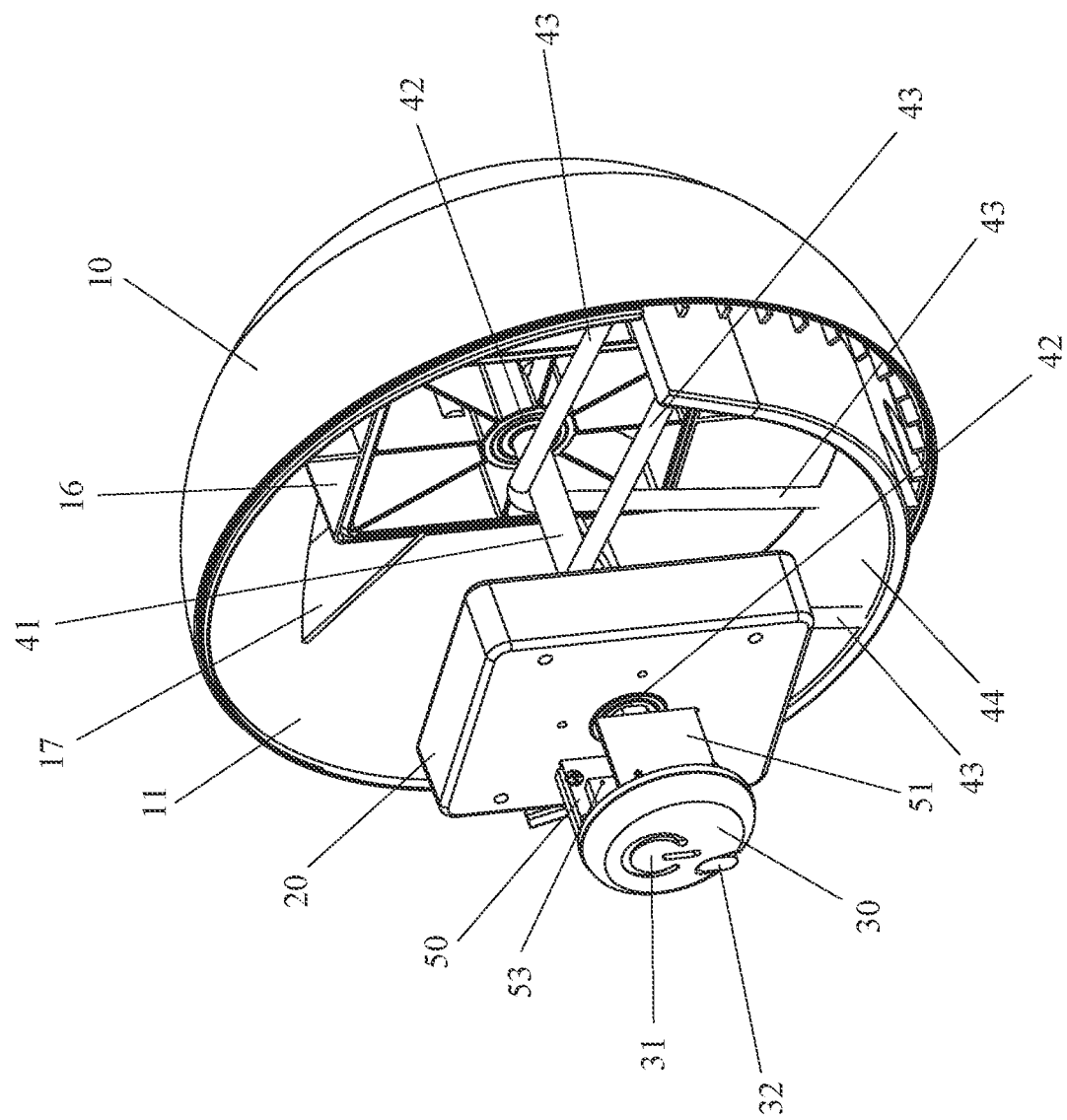
FIG. 7 is a partial perspective assembly view of the rotation exercising ball structure in accordance with the preferred embodiment of the present invention.
Figure 8:
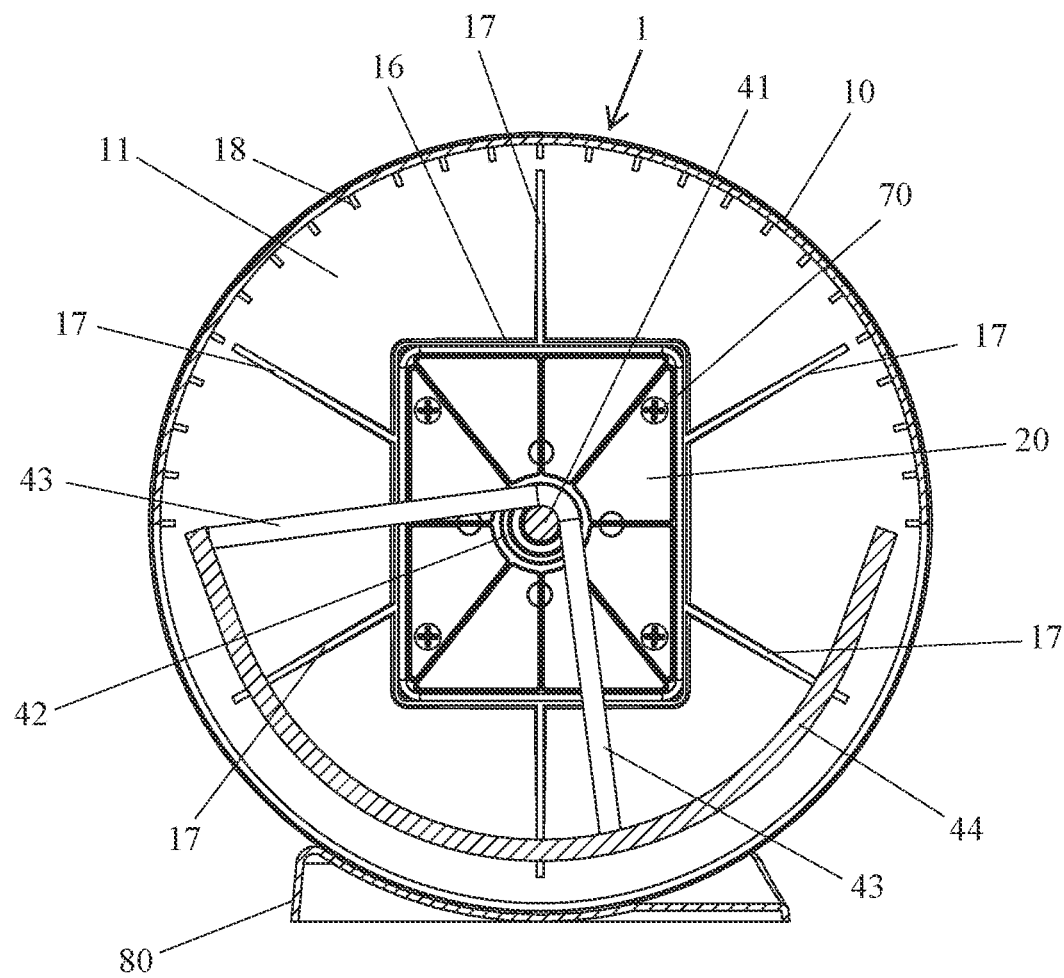
FIG. 8 is a side cross-sectional view of the rotation exercising ball structure in accordance with the preferred embodiment of the present invention.
Figure 9:
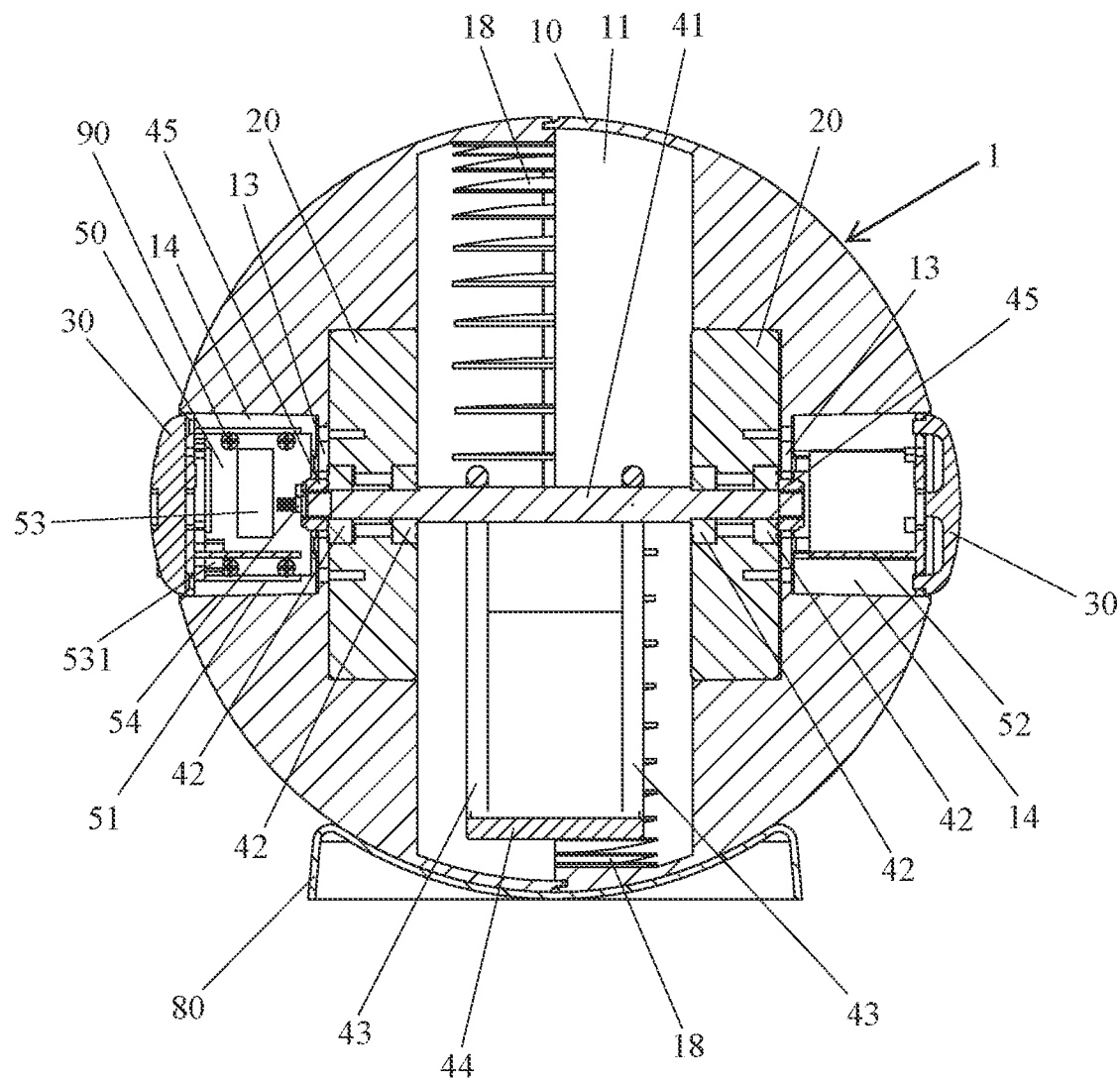
FIG. 9 is another side cross-sectional view of the rotation exercising ball structure in accordance with the preferred embodiment of the present invention.
Figure 10:
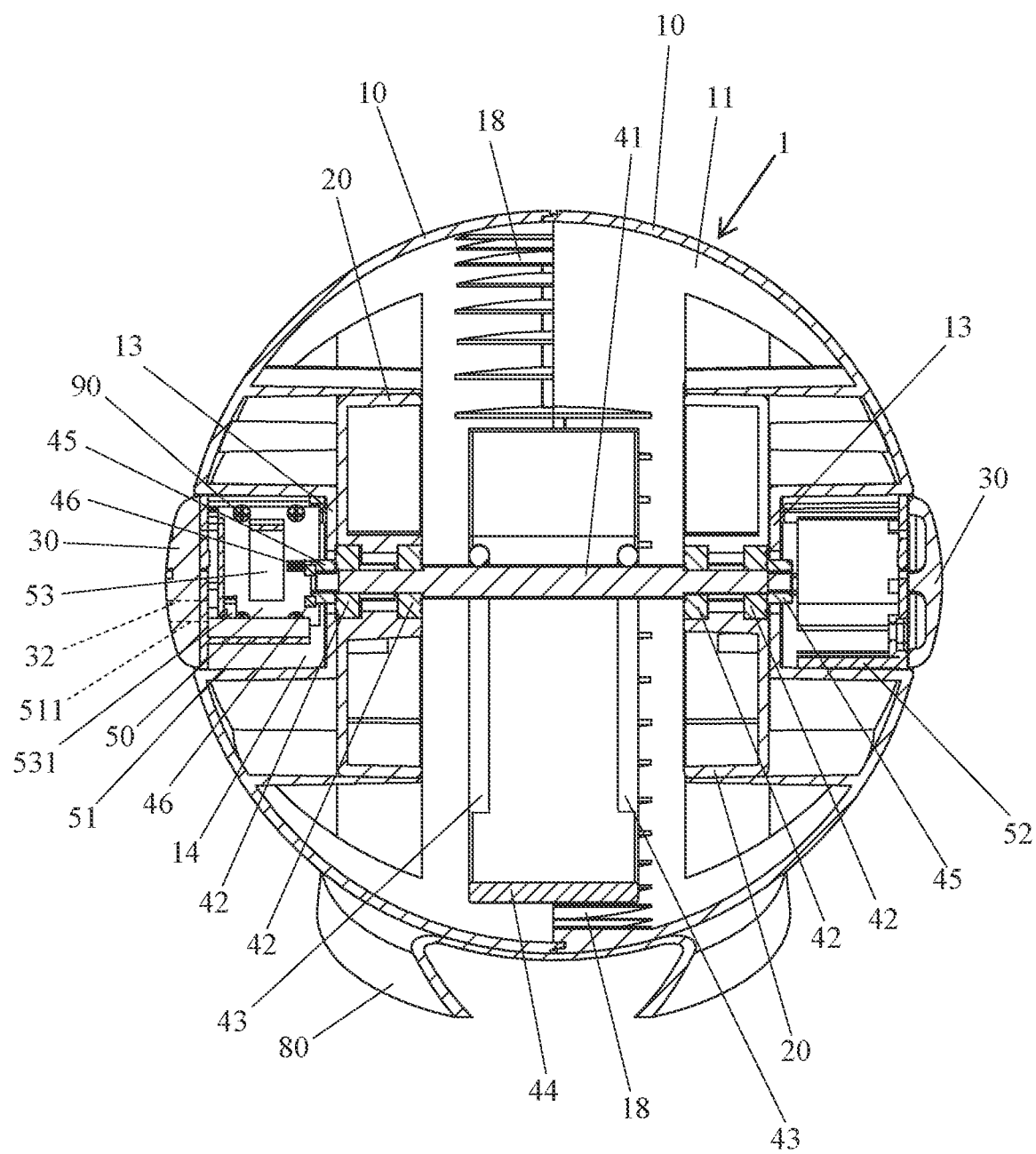
FIG. 10 is another side cross-sectional view of the rotation exercising ball structure in accordance with the preferred embodiment of the present invention.
Figure 11:
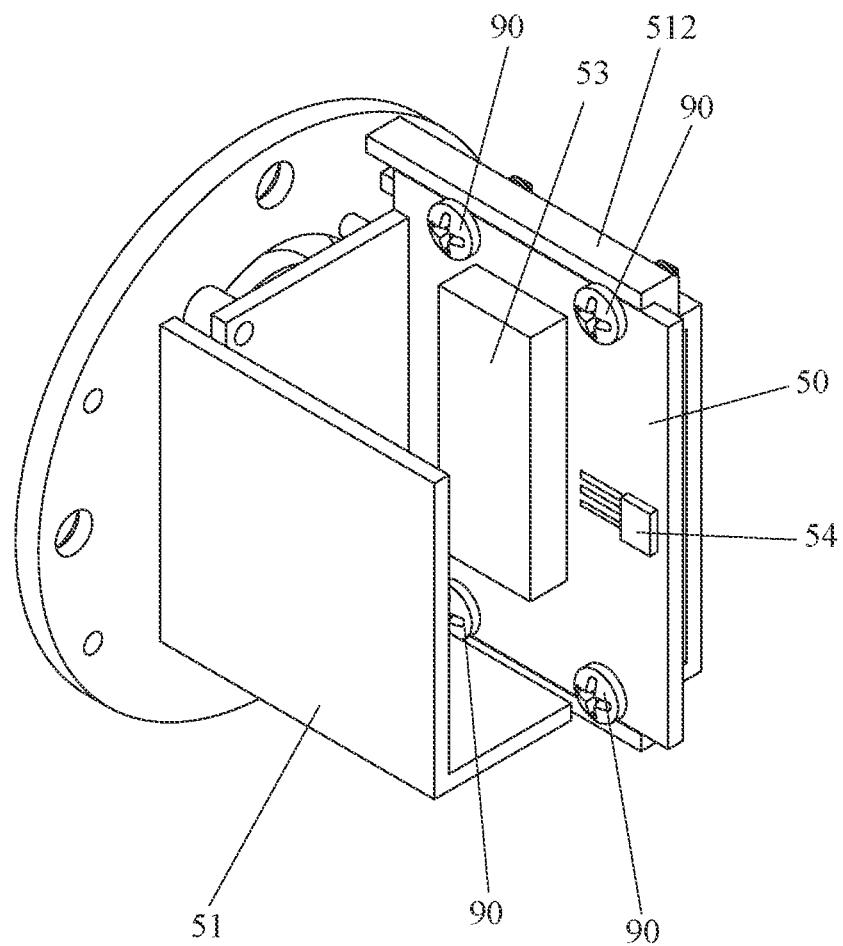
FIG. 11 is a partial perspective assembly view of the rotation exercising ball structure in accordance with the preferred embodiment of the present invention.
Figure 12:
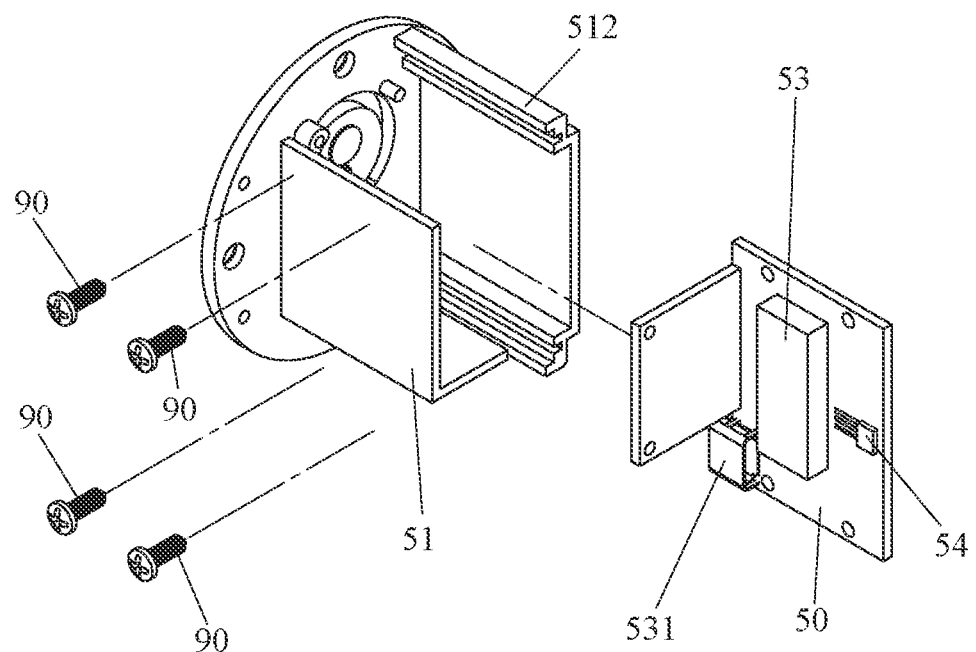
FIG. 12 is an exploded perspective view of the rotation exercising ball structure as shown in FIG. 11.

1. As shown in FIGS. 4 and 5, the bearings 42 are pivotally mounted on the two ends of the mandrel 41 so that the mandrel 41 is rotated quietly to prevent from producing noise during rotation. Thus, the user can trains hands or wrists at any time.
2. As shown in FIG. 6, each of the two shells 10 is provided with the second reinforcing ribs 18 to increase the structural strength of the hollow ball 1 when the two shells 10 are combined, so that the hollow ball 1 will not be worn or broken after falling.
3. As shown in FIGS. 1 and 2, when the two shells 10 are combined, the two holding members 30 cover the fixing holes 12 of the two shells 10 respectively so that the screws 60, 70, and 90 are hidden to enhance the outer appearance of the hollow ball 1.
4. After the two shells 10 are combined, the two ends of the mandrel 41 mounted on the mounting faces 22 of the perforations 21 of the two pivot seats 20 by the bearings 42, and the two pivot seats 20 are secured to the positioning seats 13 of the two shells 10 and located in the receiving recesses 16 of the two shells 10. In addition, each of the two shells 10 is provided with the first reinforcing ribs 17 located between the receiving recess 16 and each of the two shells 10. Thus, the mandrel 41 is rotated steadily and stably, while the at least one rotation member 43 and the weight 44 swing quickly and successively without producing deflection. Further, the mandrel 41, the at least one rotation member 43, and the weight 44 are operated smoothly and will not be worn easily to enhance the lifetime.
5. As shown in FIGS. 3, 7 and 8, the weight 44 made of iron has a determined weight and has a radial curved shape so that the weight 44 radially drives and rotates the at least one rotation member 43 easily. In addition, when a force is applied to radially rotate the at least one rotation member 43 successively, the weight 44 produce an enlarged centrifugal force as a lager weight. It is appreciated that, when the length of the weight 44 is a little less than a half of the perimeter of the hollow ball 1, the weight 44 has the optimum centrifugal effect.
6. The inner wall 14 of each of the two shells 10 is provided with the positioning rails 15, and the first housing 51 and the second housing 52 are inserted into the fixing holes 12 of the two shells 10 by guidance of the positioning rails 15 of the two shells 10 respectively so that the first housing 51 and the second housing 52 are assembled with the two shells 10 easily and quickly, thereby saving the assembly time. In addition, the first housing 51 is removed from the two shells 10 to replace the PCB 50, thereby facilitating the user replacing the PCB 50.
7. The first housing 51 and the second housing 52 are secured to the two holding members 30 respectively by the screws 60, and the PCB 50 is secured to the first housing 51 by the nuts 90, so that when the user rocks the hollow ball 1, the first housing 51, the second housing 52, and the PCB 50 are supported steadily and stably without vibration.
8. When the two magnets 46 are rotated with the mandrel 41, the Hall sensor 54 detects an information, such as the time interval, the swinging times, the consumed calory or the like, during rotation of the two magnets 46 and sends the information to the PCB 50 which processes and electrically transmits the information to the Bluetooth transmission device 53 which wirelessly transmits the information to an external portable electronic device, such as a smart phone or a tablet computer.

9. When the electric power supplied to the PCB 50, the Hall sensor 54, and the Bluetooth transmission device 53 is exhausted, the USB connector in turn passes through the entrance 32 of one of the two holding members 30 and the passage 511 of the first housing 51, and is inserted into the transmission slot 531 of the PCB 50 to charge the chargeable lithium battery of the PCB 50.

10. The hollow ball 1 is placed on the base 80 when not in use to prevent the hollow ball 1 from rolling freely and to facilitate the user storing the hollow ball 1.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the scope of the invention.

The invention claimed is:

1. A rotation exercising ball structure comprising:
   two shells, two pivot seats, two holding members, a weight unit, a first housing, a second housing, and a PCB (printed circuit board);
   wherein:
   the two shells are combined together to construct a hollow ball;
   each of the two shells has an interior provided with a space;
   the space has a bottom provided with a fixing hole;
   the fixing hole is located at a center of the space and penetrates each of the two shells;
   the bottom of the space is provided with a positioning seat;
   the positioning seat is formed with a through hole;
   the through hole penetrates the positioning seat and is connected to the fixing hole;
   each of the two shells has an inner wall formed between the through hole and the fixing hole;
   the two pivot seats are combined with the positioning seats of the two shells respectively;
   each of the two pivot seats is provided with a perforation;
   the two holding members are mounted on the two shells respectively and cover the fixing holes of the two shells respectively;
   each of the two holding members has an inner side and an outer side;
   the weight unit includes a mandrel, two magnets, at least one rotation member, and a weight;
   the mandrel is arranged transversely in the hollow ball and has two ends pivotally connected with the hollow ball;
   the two magnets are secured to one of the two ends of the mandrel;
   the at least one rotation member is connected with the mandrel;
   the at least one rotation member extends radially from a center of the mandrel;
   the weight is connected with the at least one rotation member;
   the weight is a radial curved plate;
   the weight is rotatable in the hollow ball radially and centrifugally with the mandrel served as an axis;
   the mandrel is rotated by the at least one rotation member;
   the first housing and the second housing are mounted on the inner sides of the two holding members respectively by multiple screws;
   the first housing and the second housing are inserted into the fixing holes of the two shells and combined with the inner walls of the two shells;
   the PCB is mounted in the first housing;
   the PCB is electrically connected with a Bluetooth transmission device;
   the Bluetooth transmission device is electrically connected with a Hall sensor; and
   when the mandrel is rotated, the Hall sensor detects rotation of the two magnets and sends information of rotation of the two magnets to the PCB, and the PCB processes and transmits the information to the Bluetooth transmission device.

2. The rotation exercising ball structure as claimed in claim 1, wherein the hollow ball is mounted on a base.

3. The rotation exercising ball structure as claimed in claim 1, wherein the inner wall of each of the two shells is provided with multiple positioning rails, and the first housing and the second housing are positioned and locked on the multiple positioning rails of the two shells respectively.

4. The rotation exercising ball structure as claimed in claim 1, wherein:
   the bottom of the space is provided with a receiving recess;
   the positioning seat is located in the receiving recess; and
   each of the two shells has an interior provided with multiple first reinforcing ribs formed between a periphery of the receiving recess and an inside of each of the two shells.

5. The rotation exercising ball structure as claimed in claim 1, wherein each of the two shells has an opening having a periphery provided with multiple second reinforcing ribs which are arranged and distributed evenly.

6. The rotation exercising ball structure as claimed in claim 1, wherein:
   each of the two shells is provided with multiple threaded positioning members arranged between the receiving recess and the positioning seat;
   each of the two pivot seats has a periphery provided with multiple positioning holes aligning with the multiple threaded positioning members of one of the two shells; and
   multiple screws extend through the multiple positioning holes and are screwed into the multiple threaded positioning members.

7. The rotation exercising ball structure as claimed in claim 1, wherein:
   each of the two ends of the mandrel is pivotally mounted in the perforation of one of the two pivot seats and the through hole of the positioning seat of one of the two shells;
   each of the two ends of the mandrel is pivotally connected with at least one bearing;
   the perforation of each of the two pivot seats has two ends each provided with an enlarged mounting face; and
   the at least one bearing is mounted on the mounting face of the perforation.

8. The rotation exercising ball structure as claimed in claim 1, wherein the at least one rotation member is a bending rod and has a bent section secured on the mandrel and two ends secured to the weight.

9. The rotation exercising ball structure as claimed in claim 1, wherein:

a power supply switch is mounted on one of the two holding members; and the power supply switch is electrically connected with the PCB, the Hall sensor, and the Bluetooth transmission device to electrically control an electric power of the PCB, the Hall sensor, and the Bluetooth transmission device.

10. The rotation exercising ball structure as claimed in claim 1, wherein:

the first housing is provided with a passage;

the second housing is provided with a passage;

the PCB is electrically connected with a transmission slot connected to the passage of the first housing; and one of the two holding members is provided with an entrance connected to the passage of the first housing.

11. The rotation exercising ball structure as claimed in claim 1, wherein:

the first housing is provided with multiple locking rails;

the second housing is provided with multiple locking rails; and the PCB is inserted into the first housing and locked by the multiple locking rails of the first housing.

12. The rotation exercising ball structure as claimed in claim 1, wherein two nuts are screwed onto the two ends of the mandrel, and the two magnets are secured to one of the two nuts and located adjacent to the Hall sensor.

* * * * *